(12) United States Patent
Camp, Jr. et al.

(10) Patent No.: US 6,181,199 B1
(45) Date of Patent: Jan. 30, 2001

(54) POWER IQ MODULATION SYSTEMS AND METHODS

(75) Inventors: William O. Camp, Jr., Chapel Hill; Paul W. Dent, Pittsboro; Alan R. Holden, Apex, all of NC (US)

(73) Assignee: Ericsson Inc., Research Triangle Park, NC (US)

( * ) Notice: Under 35 U.S.C. 154(b), the term of this patent shall be extended for 0 days.

(21) Appl. No.: 09/226,478

(22) Filed: Jan. 7, 1999

(51) Int. Cl.[7] .................................................. H03F 3/38
(52) U.S. Cl. ............................................. 330/10; 330/149
(58) Field of Search ........................... 330/10, 51, 124 R, 330/149

(56) References Cited

U.S. PATENT DOCUMENTS

| | | |
|---|---|---|
| 2,210,028 | 8/1940 | Doherty . |
| 3,448,366 | 6/1969 | Goff ........................................ 363/43 |
| 3,777,275 | 12/1973 | Cox ......................................... 330/10 |
| 3,805,139 | 4/1974 | Hoffman, Jr. et al. ................... 321/5 |
| 3,906,401 | 9/1975 | Seidel ..................................... 332/18 |
| 3,909,742 | 9/1975 | Cox et al. ............................... 330/84 |
| 3,927,379 | 12/1975 | Cox et al. ............................... 330/10 |
| 4,090,147 | 5/1978 | Seidel ..................................... 330/10 |
| 4,178,557 | 12/1979 | Henry ..................................... 330/10 |
| 4,315,107 | 2/1982 | Ciesielka et al. ................... 179/16 F |

(List continued on next page.)

FOREIGN PATENT DOCUMENTS

| | | |
|---|---|---|
| 0 471 346 A1 | 2/1992 | (EP) . |
| 0 598 585 A2 | 5/1994 | (EP) . |
| 0 708 546 A2 | 4/1996 | (EP) . |
| 0 725 478 A1 | 8/1996 | (EP) . |
| 2 267 402 | 12/1993 | (GB) . |
| WO 97/48219 | 12/1997 | (WO) . |
| WO 99/55206 | 10/1999 | (WO) . |

OTHER PUBLICATIONS

U.S. application No. 09/054,063, Dent, filed Apr. 2, 1998.
U.S. application No. 09/054,060, Dent, filed Apr. 2, 1998.

(List continued on next page.)

*Primary Examiner*—Robert Pascal
*Assistant Examiner*—Khanh Van Nguyen
(74) *Attorney, Agent, or Firm*—Myers Bigel Sibley & Sajovec

(57) ABSTRACT

Power IQ modulation systems and methods include first and second power amplifiers, each including a signal input, a supply input and a power input. The first and second power amplifiers are preferably class-C power amplifiers. A source of first, second, third and fourth reference frequency signals is also provided. The first and second reference frequency signals are inverted relative to one another, and the third and fourth reference frequency signals are inverted relative to one another. Preferably, the first, second, third and fourth reference frequency signals are 0°, 180°, 90° and 270° phase shifted reference frequency signals, respectively. A switching system is also provided that selectively applies one of the first and second reference frequency signals to the signal input of the first power amplifier as a function of the polarity of one of the I and Q input signals. The switching system also selectively applies one of the third and fourth reference frequency signals to the signal input of the second power amplifier as a function of the polarity of the other of the I and Q input signals. A third amplifier, preferably a class-D amplifier, is responsive to the one of the I and Q input signals to supply a first variable supply voltage to the supply input of the first amplifier. A fourth amplifier, also preferably a class-D amplifier, is responsive to the other of I and Q input signals to supply a second variable supply voltage to the supply input of the second amplifier. A coupler couples the power outputs of the first and second power amplifiers to a load such as a radiotelephone antenna. Accordingly, power IQ modulation is provided that can use class-C and class-D amplifiers that are highly efficient.

52 Claims, 6 Drawing Sheets

U.S. PATENT DOCUMENTS

| | | | |
|---|---|---|---|
| 4,420,723 | 12/1983 | de Jager | 330/10 |
| 4,433,312 | 2/1984 | Kahn | 332/22 |
| 4,485,357 | 11/1984 | Voorman | 332/17 |
| 4,509,017 | 4/1985 | Andren et al. | 329/105 |
| 4,580,111 | 4/1986 | Swanson | 332/41 |
| 4,791,815 | 12/1988 | Yamaguchi et al. | 73/1.37 |
| 4,862,116 | 8/1989 | Olver | 332/23 R |
| 5,077,539 | 12/1991 | Howatt | 330/10 |
| 5,086,450 | 2/1992 | Kitagawa et al. | 379/40 |
| 5,365,187 * | 11/1994 | Hornak | 330/10 |
| 5,410,280 | 4/1995 | Linguet et al. | 332/149 |
| 5,420,541 | 5/1995 | Upton et al. | 330/286 |
| 5,438,301 | 8/1995 | Havens et al. | 331/45 |
| 5,453,717 | 9/1995 | Gerfault | 330/146 |
| 5,483,433 | 1/1996 | Yang | 363/43 |
| 5,483,681 | 1/1996 | Bergsten et al. | 455/126 |
| 5,559,468 * | 9/1996 | Gailus et al. | 330/149 |
| 5,568,088 | 10/1996 | Dent et al. | 330/151 |
| 5,574,967 | 11/1996 | Dent et al. | 455/12.1 |
| 5,612,651 | 3/1997 | Chethik | 332/103 |
| 5,631,604 | 5/1997 | Dent et al. | 330/124 R |
| 5,638,024 | 6/1997 | Dent et al. | 330/84 |
| 5,682,303 | 10/1997 | Goad | 363/71 |
| 5,694,093 * | 12/1997 | DaSilva et al. | 330/103 |
| 5,732,333 * | 3/1998 | Cox et al. | 330/149 |
| 5,734,565 | 3/1998 | Mueller et al. | 363/132 |
| 5,767,750 | 6/1998 | Yamaji | 332/103 |
| 5,778,029 | 7/1998 | Kaufmann | 375/296 |
| 5,815,531 | 9/1998 | Dent | 375/298 |
| 5,900,778 * | 5/1999 | Stonick et al. | 330/149 |
| 5,930,128 | 7/1999 | Dent | 363/43 |
| 5,990,734 * | 11/1999 | Wright et al. | 330/149 |

OTHER PUBLICATIONS

Chireix, "*High Power Outphasing Modulation*," Proceedings of the Institute of Radio Engineers, vol. 23, No. 11, Nov. 1935, pp. 1370–1392.

U.S. application No. 09/209,104, Dent, filed Dec. 10, 1998.

U.S. application No. 09/208,912, Dent et al., filed Dec. 10, 1998.

U.S. application No. 09216,466, Holden et al., filed Dec. 18, 1998.

International Search Report, PCT/US99/27008, Feb. 24, 2000.

International Search Report, PCT/US99/24332, Feb. 24, 2000.

Morais et al., NLA–QAM: A Method for Generating High–Power QAM Signals Through Nonlinear Amplification, IEEE Transactions on Communications, vol. Com–30, No. 3, Mar. 1982, pp. 517–522.

International Search Report, PCT/US99/05681, Jul. 6, 1999.

International Search Report, PCT/US99/26913, Jul. 24, 2000.

* cited by examiner

POWER IQ MODULATION SYSTEMS AND METHODS

FIELD OF THE INVENTION

This invention relates to modulation systems and methods, and more particularly to IQ modulation systems and methods.

BACKGROUND OF THE INVENTION

Modulation systems and methods are widely used in transmitters to modulate information including voice and/or data onto a carrier. The carrier may be a final carrier or an intermediate carrier. The carrier frequency can be in UHF, VHF, RF, microwave or any other frequency band. Modulators are also referred to as "mixers" or "multipliers". For example, in a mobile radiotelephone, a modulator is used for the radiotelephone transmitter.

FIG. 1 illustrates a conventional IQ modulator. As shown in FIG. 1, an IQ modulator 10, also referred to as a "quadraphase modulator" or a "quadrature modulator" includes a quadrature splitter 20, also known as a 90° phase shifter, and a pair of multipliers 16a, 16b coupled to the quadrature splitter. A controlled oscillator 15, such as a Voltage Controlled Oscillator (VCO), is coupled to the quadrature splitter 20 to produce 90° phased shifted oscillator signals. In-phase (I) data 11a and quadrature-phase (Q) data 11b are coupled to a respective multiplier or mixer 16a, 16b. Digital input data is converted to analog data by I Digital-to-Analog Converter (DAC) 14a and Q DAC 14b, respectively. The outputs of the respective DACs 14a and 14b are applied to the respective low pass filters 12a and 12b to provide the respective I and Q data inputs 11a and 11b. The modulator modulates the input data on a carrier 13, by summing the outputs of the multipliers 16a, 16b at a summing node 218. The modulated carrier is amplified by a power amplifier 22 and transmitted via an antenna 24.

In modern radiotelephone communications, mobile radiotelephones continue to decrease in size, cost and power consumption. In order to satisfy these objectives, it is generally desirable to provide IQ modulation systems and methods that can provide high power modulation while reducing the amount of battery power that is consumed. Unfortunately, the power amplifier 22 of an IQ modulator may consume excessive power due to efficiency limitations therein. More specifically, it is known to provide a linear class-A or class-AB power amplifier 22 that may have efficiencies as low as 30 percent or less. Thus, large amounts of battery power may be wasted as heat. Moreover, the noise figure of a conventional IQ modulator may be excessive so that high cost Surface Acoustic Wave (SAW) filters may need to be used.

It is also known to separately modulate the amplitude and phase of an input signal using an "rTheta" technique. In the rTheta technique, the phase is modulated at the oscillator, and the amplitude is modulated at the power amplifier stage. Unfortunately, the rTheta technique may require the oscillator phase lock loop to support the phase modulation bandwidth. With wide bandwidth radiotelephone signals such as TDMA and CDMA signals, it may be increasingly difficult to provide the requisite bandwidth in the oscillator phase lock loop.

SUMMARY OF THE INVENTION

It is therefore an object of the present invention to provide improved IQ modulation systems and methods.

It is another object of the present invention to provide IQ modulation systems and methods that can provide high efficiency.

It is still another object of the present invention to provide IQ modulation systems and methods that do not require the use of linear amplifiers.

These and other objects are provided, according to the present invention, by providing power IQ modulation systems that modulate in-phase (I) and quadrature-phase (Q) input signals in the power amplifiers themselves. High efficiency class-C and class-D power amplifiers may be used.

Power modulation systems according to the present invention include first and second power amplifiers, each including a signal input, a supply voltage input and a power output. The first and second power amplifiers are preferably class-C power amplifiers. A source of first, second, third and fourth reference frequency signals is also provided. The first and second reference frequency signals are inverted relative to one another, and the third and fourth reference frequency signals are inverted relative to one another. Preferably, the first, second, third and fourth reference frequency signals are 0°, 180°, 90° and 270° phase shifted reference frequency signals, respectively.

A switching system is also provided that selectively applies one of the first and second reference frequency signals to the signal input of the first power amplifier as a function of the polarity of one of the I and Q input signals. The switching system also selectively applies one of the third and fourth reference frequency signals to the signal input of the second power amplifier as a function of the polarity of the other of the I and Q input signals.

A third amplifier, preferably a class-D amplifier, is responsive to the one of the I and Q input signals to supply a first variable supply voltage to the supply input of the first amplifier. The supply voltage input preferably corresponds to the drain or collector voltage of the output stage of the first amplifier. A fourth amplifier, also preferably a class-D amplifier, is responsive to the other of I and Q input signals to supply a second variable supply voltage to the supply input of the second amplifier. A coupler couples the power outputs of the first and second power amplifiers to a load such as a radiotelephone antenna. Accordingly, power IQ modulation is provided that can use class-C and class-D amplifiers that are highly efficient.

The first, second, third and fourth reference frequency signals may be generated by a controlled oscillator that produces the first reference frequency signal. A first inverter is responsive to the controlled oscillator to produce the second reference frequency signal. A phase shifter is responsive to the controlled oscillator to produce the third reference frequency signal. A second inverter is responsive to the phase shifter to produce the fourth reference frequency signal.

The switching system may include a first switch that is responsive to the one of the I and Q input signals being positive, to couple the first reference frequency signal to the first power amplifier. The first switch is also responsive to the one of the I and Q input signals being negative, to couple the second reference frequency signal to the first power amplifier. A second switch is responsive to the other of the I and Q input signals being positive, to couple the third reference frequency signal to the second power amplifier. The second switch is also responsive to the other of the I and Q input signals being negative to couple the fourth reference frequency signal to the second power amplifier. A first polarity detector may be provided, that is coupled between the one of the I and Q input signals and the first switch, to detect whether the one of the I and Q input signals is positive or negative. A second polarity detector may also be provided, that is coupled between the other of I and Q input signals and the second switch, to detect whether the other of the I and Q input signals is positive or negative.

A first analog-to-digital converter also may be coupled between the one of the I and Q input signals and the third amplifier, such that the third amplifier is responsive to a digital representation of the one of the I and Q signals to supply a first variable supply voltage to the supply input of the first amplifier. A second analog-to-digital converter also may be provided, that is coupled between the other of the I and Q input signals and the fourth amplifier, such that the fourth amplifier is responsive to a digital representation of the other of the I and Q signals to supply a second variable voltage supply to the supply input of the second amplifier. The analog-to-digital converters are preferably delta-sigma analog-to-digital converters.

Various embodiments of couplers that couple the power outputs of the first and second power amplifiers to the load may also be provided. The coupler may include a matching network that couples the first and second power amplifiers to a load such as a radiotelephone antenna. The coupler preferably isolates the first and second power amplifiers from one another while coupling the first and second power amplifiers to the load. The coupler may include a first quarter wavelength transmission line that couples the first power amplifier to the matching network and a second quarter wavelength transmission line that couples the second power amplifier to the matching network. In a non-preferred but nevertheless useful implementation, the coupler may include a first isolator that couples the first power amplifier to the matching network and a second isolator that couples the second power amplifier to the matching network. The matching network may also be a voltage-to-current converting matching network, such as a quarter-wave transmission line or discrete component equivalent thereof. These coupling techniques also are illustrated in application Ser. No. 09/054,063, filed Apr. 2, 1998, entitled "Hybrid Chireix/Doherty Amplifiers and Methods" to the present co-inventor Dent assigned to the assignee of the present invention, the disclosure of which is hereby incorporated herein by reference, and application Ser. No. 09/054,060, filed Apr. 2, 1998 entitled "Power Waveform Synthesis Using Bilateral Devices" to the present co-inventor Dent, assigned to the assignee of the present invention, the disclosure of which is hereby incorporated herein by reference.

Finally, it is known that the first and second class-C amplifiers may have a nonlinear amplitude and/or phase response as a function of the respective first and second variable supply voltages. Power modulation according to the invention may include amplitude distortion and phase distortion compensation that is responsive to the I and Q input signals, to modify the I and Q input signals to reduce the nonlinear amplitude response. In particular, compensation systems and methods are responsive to the I and Q input signals, to generate predistorted I and Q signals, and to apply the predistorted I and Q signals to the switching system and to the third and fourth amplifiers, to thereby compensate for the nonlinear distortion.

More specifically, a lookup table may be provided that is responsive to the I input signal, to produce a first amplitude distortion compensating value and a first phase compensating value, and that is responsive to the Q input signal to produce a second amplitude distortion compensating value and a second phase compensating value. A pair of lookup subtables may also be provided. A summer is also provided that adds the first amplitude distortion compensating value and the second phase compensating value to produce the predistorted I signal, and that subtracts the first phase compensating value from the second amplitude distortion compensating value, to produce the predistorted Q signal. A separate adder and subtractor also may be provided. Compensation systems and methods according to the invention also may be used separately to precompensate for distortion in an amplifier that produces distortion.

Accordingly, the present invention can provide power IQ modulation at high efficiency to thereby allow reduced size, cost and/or power consumption of a mobile radiotelephone or other transmitter. Wide bandwidth oscillator phase lock loops need not be used, and high performance SAW filters may not be needed to reduce transmitted noise. Associated power modulation methods are also provided.

DETAILED DESCRIPTION OF PREFERRED EMBODIMENTS

Figure 1:
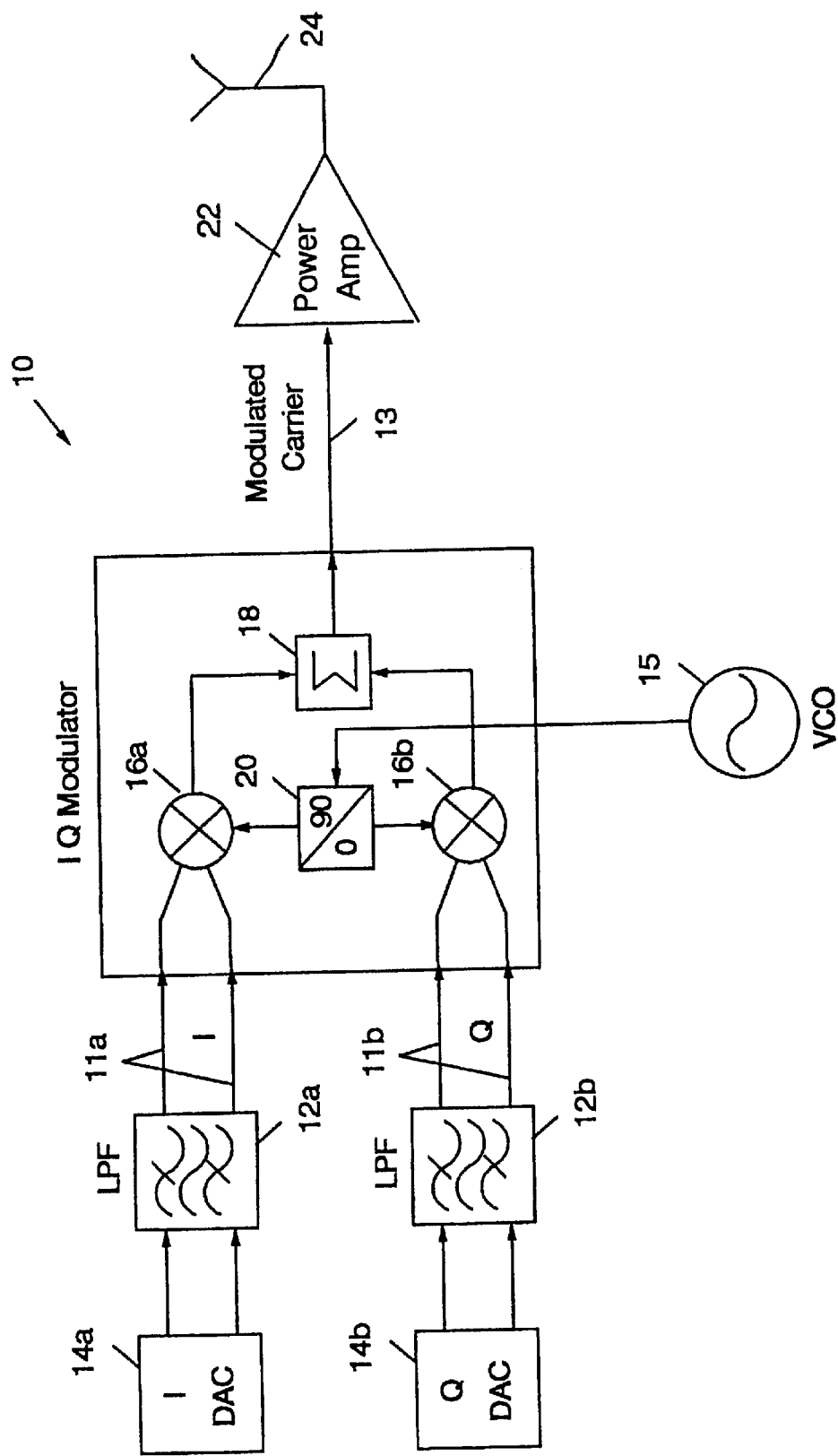
FIG. 1 is a block diagram of a conventional IQ modulator.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "coupled" to another element, it can be directly coupled to the other element or intervening elements may also be present.

As will be appreciated by one of skill in the art, the present invention may be embodied as systems (apparatus) or methods. The present invention may take the form of an entirely hardware embodiment or an embodiment combining software and hardware aspects.

Accordingly, individual blocks and combinations of block in the drawings support combinations of means for performing the specified functions and combinations of steps for performing the specified functions. Each of the blocks of the drawings may be embodied in many different ways, as is well known to those of skill in the art.

Figure 2:
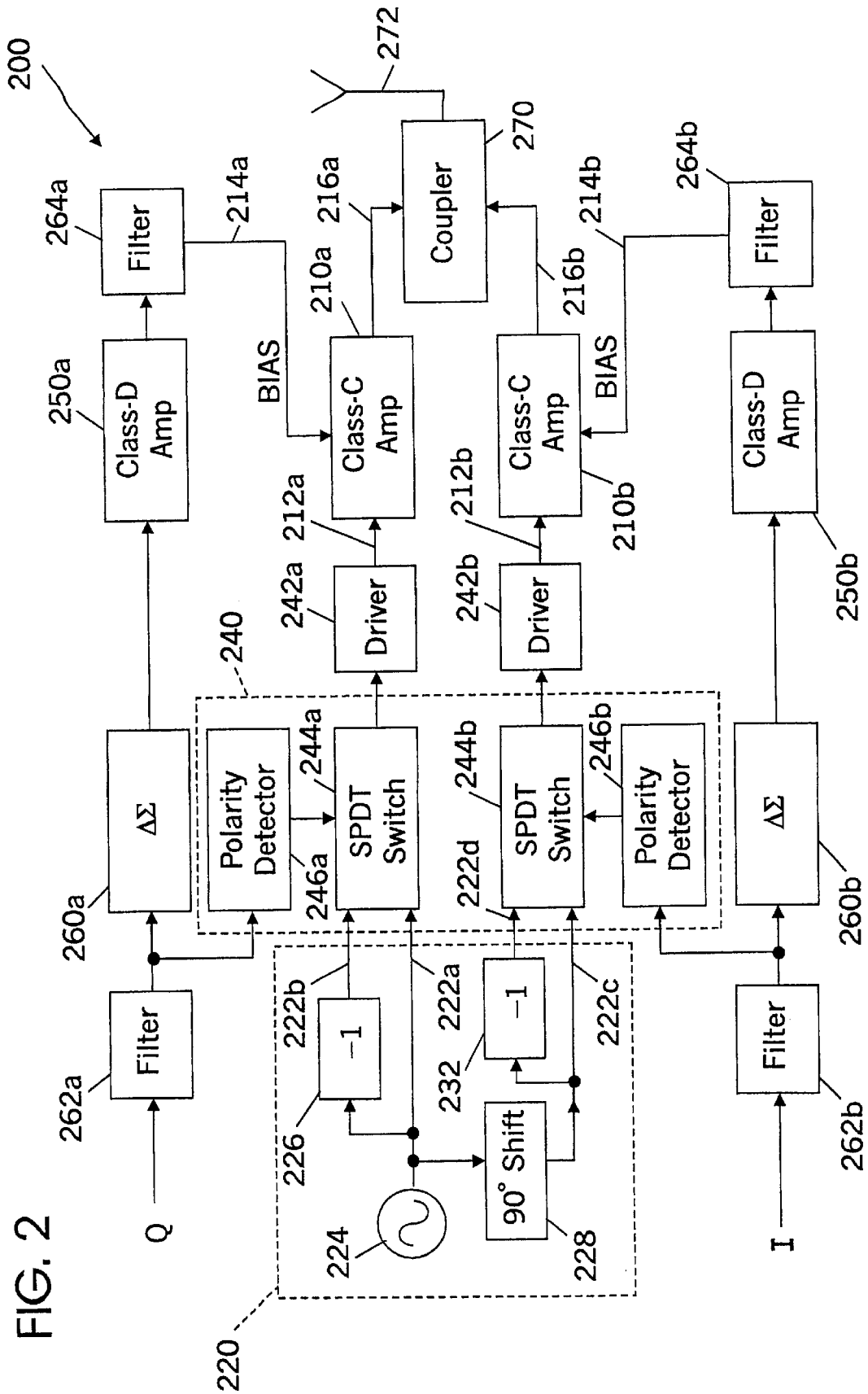
FIGS. 2–5 are block diagrams of power IQ modulation systems and methods according to the present invention.

Referring now to FIG. 2, power IQ modulation systems and methods according to the present invention will now be described. As shown in FIG. 2, power modulation systems and methods 200 modulate and amplify in-phase I and quadrature-phase Q input signals, in respective I and Q paths. Elements in the Q path are designated by the reference character a and elements in the I path are designated by the reference character b. As shown in FIG. 2, first and second power amplifiers 210a and 210b, respectively, are included. Each of the first and second power amplifiers 210a and 210b includes a respective signal input 212a, 212b, supply input 214a, 214b and power output 216a, 216b.

A reference frequency source 220 generates first, second, third and fourth reference frequency signals 222a–222d. The first and second reference frequency signals 222a and 222b are inverted relative to one another and the third and fourth reference frequency signals 222c and 222d are inverted relative to one another. Preferably, the first through fourth reference frequency signals 222a–222d are 0°, 180°, 90° and 270° phase shifted reference frequency signals, respectively.

As shown in FIG. 2, the reference frequency source 220 preferably includes a controlled oscillator such as a voltage controlled oscillator 224 that produces the first reference frequency signal 222a A phase-locked loop may also be included. A first inverter 226 is responsive to the controlled oscillator 224 to produce the second reference frequency signal 222b. A phase shifter 228 is responsive to the controlled oscillator 224 to produce the third reference frequency signal 222c. A second inverter 232 is responsive to the phase shifter 228 to produce the fourth reference frequency signal 222d. However, it will be understood by those having skill in the art that many other techniques may be used to generate a reference frequency or phase inverted reference frequency signals under control of a sign bit.

Continuing with the description of FIG. 2, a switching system 240 selectively applies one of the first and second reference frequency signals 222a or 222b to the signal input 212a of the first power amplifier 210a as a function of the polarity of one of the I and Q input signals, for example the Q input signal. The switching system 240 also selectively applies one of the third and fourth reference frequency signals 222c or 222d to the signal input 212b of the second power amplifier 210b as a function of the polarity of the other of the I and Q input signals, for example, the I input signal. First and second drivers 242a, 242b, respectively, may be inserted between the switching system 240 and the respective class-C amplifier 210a, 210b to overdrive the class-C amplifier 210a, 210b, if necessary, to achieve the desired gain or drive power level for amplifiers 210a, 210b.

As shown in FIG. 2, the switching system preferably comprises a first switch such as a first Single-Pole Double-Throw (SPDT) switch 244a that is responsive to the one of the I and Q input signals being positive to couple the first reference frequency signal 222a to the first power amplifier 210a, and that is responsive to the one of the I and Q input signals being negative to couple the second reference frequency signal 222b to the first power amplifier 210a. A second switch such as a second SPDT switch 244b, is responsive to the other of the I and Q input signals being positive to couple the third reference frequency signal 222c to the second power amplifier 210b, and that is responsive to the other of the I and Q input signals being negative to couple the fourth reference signal 222d to the second power amplifier 210b. One skilled in the art will understand that a balanced modulator may be used instead of SPDT switches to selectively invert a reference signal.

As also shown in FIG. 2, the switching system 240 also preferably comprises a first polarity detector 246a that is coupled between the one of the I and Q input signals and the first switch 244a, to detect whether the one of the I and Q input signals is positive or negative. A second polarity detector 246b is coupled between the other of the I and Q input signals and the second switch 244b, to detect whether the other of the I and Q input signals is positive or negative.

Still continuing with the description of FIG. 2, a third amplifier 250a, preferably a class-D amplifier, is responsive to the one of the I and Q input signals, for example the Q input signal, to supply a first variable supply voltage to the supply input 214a of the first amplifier 210a. A fourth amplifier 250b is responsive to the other of the I and Q input signals, for example the I input signal, to supply a second variable supply voltage to the supply input 214b of the second amplifier 210b.

In order to generate the appropriate inputs for the third and fourth amplifiers 250a and 250b, respectively, a first analog-to-digital converter, preferably a delta-sigma analog-to-digital converter 260a, is coupled between the one of the I and Q input signals and the third amplifier 250a, such that the third amplifier is responsive to a digital representation to the one of the I and Q signals to supply a first variable supply voltage to the supply input 214a of the first amplifier 210a. A second analog-to-digital converter, preferably a second delta-sigma analog-to-digital converter 260b, is coupled between the other of the I and Q input signals and the fourth amplifier 250b, such that the fourth amplifier 250b is responsive to a digital representation of the other of the I and Q signals to supply a second variable supply voltage input 214b of the second amplifier 210b. As shown in FIG. 2, low pass filters 262a, 262b, 264a and 264b may filter the Q and I inputs and the outputs of the third and fourth amplifiers 250a and 250b respectively. Often, I and Q signals are generated in digital form by a Digital Signal Processor (DSP). The DSP can include lowpass filters 262a and 262b in digital form. Delta-Sigma converters 260a and 260b can then convert the filtered digital sample streams from the DSP from a Pulse Coded Modulation (PCM) format to a Delta-Sigma representation by an entirely digital logic process and system.

Finally, a coupler 270 couples the power outputs 216a and 216b of the first and second power amplifiers 210a and 210b to a load 272 such as radiotelephone antenna. In one embodiment, the coupler 270 includes a matching network that couples the first and second power amplifiers to the load 272 while preferably isolating the first and second power amplifiers 210a and 210b from one another.

Operation of power modulation systems and methods of FIG. 2 will now be described. The frequency of the controlled oscillator 224 is preferably set to the transmitted carrier frequency. The 90° phase shifter 228 preferably creates an identical signal but with a phase shift of 90° from the original signal. The original signal and the 90° shifted signal are then sent to inverters 226 and 232, which are amplifiers with a gain of −1. Thus, four reference frequency signals 222a–222d are present. They preferably represent +sin and −sin, and +cos and −cos of the controlled oscillator 224.

The two switches 244a and 244b are controlled to select a polarity of the sin for one channel and a polarity of the cos for the other channel. These signals proceed independently to the driver amplifier stages 242a and 242b and the power amplifier outputs stages 210a and 210b.

The control of the polarity of the sin or cos signals preferably coincides with the amplitude of the I or Q channel becoming zero. This can reduce introduction of polarity change induced noise into the output signal spectrum.

The two power amplifier output stages are preferably coupled with series blocking capacitors in the coupler 270 so that the supply voltages, preferably corresponding to drain voltages of the class-C amplifiers, can be controlled independent of each other. Preferably, the distance from the class-C amplifiers 210a and 210b to the coupler 270 is short relative to the wavelength of the carrier frequency.

The class-C amplifier supply voltages 214a and 214b preferably are created in an efficient manner by class-D amplifiers 250a and 250b, using low pass filters 246a and 246b to remove the switching noise. The input signals to the class-D amplifiers 250*a* and 250*b* are created by a delta-sigma process so that the noise in the bandwidth of the low pass filters 246*a* and 246*b* can be reduced. Accordingly, using the appropriate I and Q signals, it is possible to create any desired trajectory in the vector of the phase plane. The Class D amplifiers are preferably capable both of sourcing and sinking current so that current can even flow from the amplifiers 210*a* and 210*b* back to the supply during periods of a modulation cycle.

The power amplifiers 210*a* and 210*b* preferably are saturated class-C amplifiers rather than linear power amplifiers. Higher efficiency may therefore be obtained. Out-of-band noise can be reduced, which can eliminate the need for additional SAW filters in the chain. Finally, a large modulation bandwidth can be supported. This bandwidth may be limited only by the filter bandwidth of the low pass filters 264*a* and 264*b* that follow the class-D amplifier stages 250*a* and 250*b*, respectively.

Figure 3:
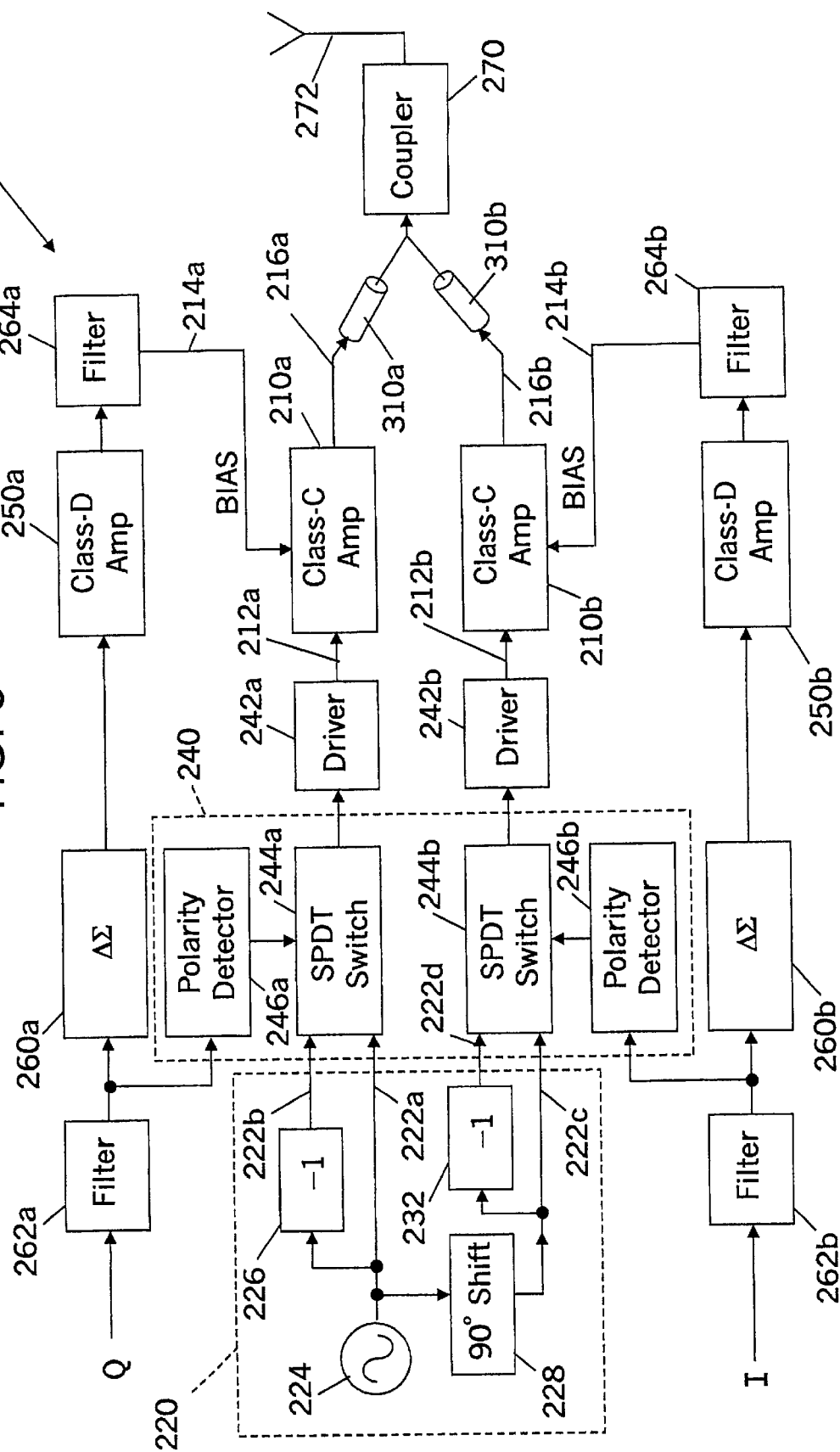

FIG. 3 is a block diagram of a second embodiment of power IQ modulation systems and methods according to the invention. Power modulation systems and methods 200' of FIG. 3 are similar to those of FIG. 2, except that a respective quarter wavelength transmission line 310*a* and 310*b* of appropriate impedance is included in each branch of the final output stage between the power output 216*a* and 216*b* of the class-C amplifiers 210*a* and 210*b* and the coupler 270, as disclosed in the above-incorporated applications.

Figure 4:
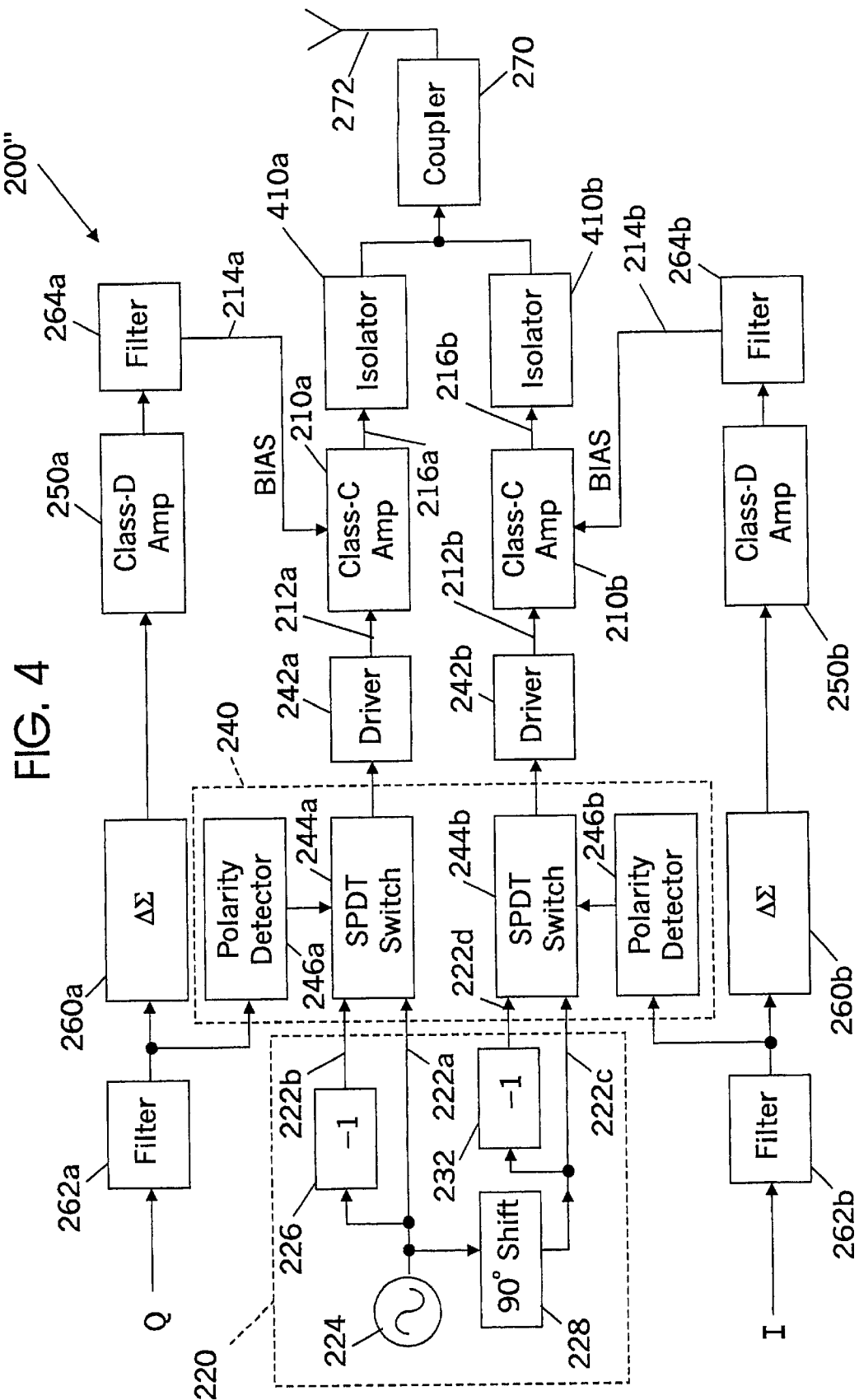

Alternatively, in a third embodiment 200" shown in FIG. 4, a pair of isolators 410*a* and 410*b* may be included between the power outputs 216*a* and 216*b* and the matching network 270. Although this arrangement may not provide high efficiency, it may offer a simplified combination and the possibility of improved linearity for applications where that is desired. As an example, coupler 270 may be two separate matching networks, each connected to an isolator 410 that increases the impedance from 50 ohms at the isolator to 100 ohms at the point where the two matching networks are joined and attached to the feedline to antenna 272.

Figure 5:
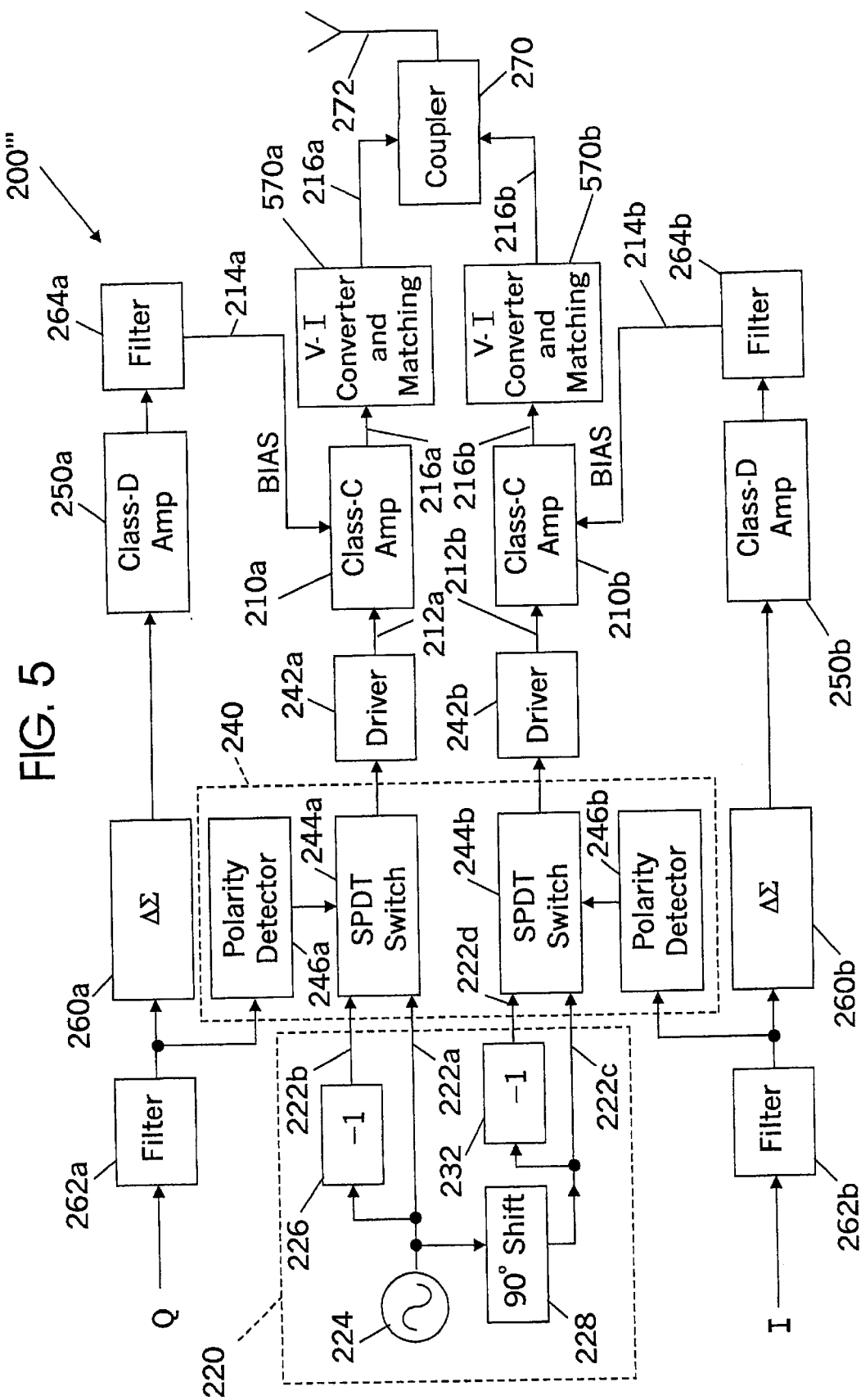

FIG. 5 illustrates yet another embodiment 200"' wherein the coupler 270 is replaced by a pair of voltage-to-current (VI) converters and matching networks 570*a* and 570*b*.

Each of the embodiments of FIGS. 3–5 may have various advantages and disadvantages. For example, the embodiment of FIG. 3 uses quarter wavelength transmission lines 310*a* and 310*b* to convert the predominantly voltage source of the power amplifier stages 210*a* and 210*b* to currents. The currents can then be added in parallel and supplied to the load through the coupler 270.

The embodiment of FIG. 4 uses a pair of isolators 410*a* and 410*b* to combine the outputs from the two power amplifier output stages 210*a* and 210*b*. The isolators may reduce interaction between the two power amplifier stages 210*a* and 210*b* at the expense of overall efficiency. Finally the embodiment of FIG. 5 uses the matching network 570*a* and 570*b* to convert the voltage output of the class-C amplifiers 210*a* and 210*b* to current for addition in the load.

Class-C amplifiers 210*a*, 210*b* can have a nonlinear relationship between supply voltage and output level, resulting in distortion. Such amplifiers can also suffer from Amplitude Modulation to Phase Modulation (AM-to-PM) conversion, whereby modulation of the amplitude produces undesired modulation of the phase. The invention can also include methods and systems to compensate for such signal distortion.

Such precompensation can be either feedforward precompensation, where I and Q signals are precompensated for the known distortion that the amplifiers will introduce, or feedback precompensation where the phase or amplitude of the output signal is sensed, compared to desired values to obtain error quantities, the error quantities then being used to generate corrected I, Q values that will result in the desired output signal being produced more accurately. Feedback systems can also be either real-time feedback systems, or "off-line" or "learning" systems which gradually adjust the way in which I, Q values are precompensated so as to produce the desired output signal more accurately.

In general, output signal amplitude may be measured using a power detector, but output phase may be more difficult to measure, as phase generally is measured relative to a phase reference signal. Therefore, although a feedback technique of controlling amplitude linearity may be quite practical, a feedforward technique of compensating for AM-to-PM conversion may be more practical.

A preferred technique of compensating distortion comprises use of a digital signal processor to generate compensated I and Q signals. For example, a technique of precompensating conventional amplifiers as well as AM-to-PM conversion that depends on the total output signal amplitude, can comprise using the digital signal processor to compute the desired total amplitude of the output signal from the square root of $I^2+Q^2$.

The desired amplitude is then applied as an address to a prestored look-up table to obtain an amplitude compensating value that is used to scale both the I and Q values to obtain amplitude-compensated I and Q values which, when then used for modulation, can result in the correct, desired output signal amplitude being produced.

Either the original desired amplitude or the compensated amplitude may then be applied to a prestored phase compensating table to obtain a phase compensating value that compensates for AM-to-PM conversion. The phase compensating value is then used in complex multiplication with the amplitude-compensated I and Q values to obtain phase and amplitude compensated I and Q values that, when used for modulation, can result in the correct, desired signal amplitude being produced.

The number of multiplications generally needed for precompensating for AM-to-PM conversion and for amplitude nonlinearity is 6, but this may be reduced to 4 by the following technique:

Denote the desired amplitude by $A(t)=(I(t)^2+Q(t)^2)^{1/2}$. Then if the amplifier produces an amplitude distortion function F(A) and a phase rotation equivalent to multiplication by the complex number $[\cos(\phi(A)), \sin(\phi(A))]$, then the original I,Q values should be corrected when modified by the following equation:

$$\begin{bmatrix} I' \\ Q' \end{bmatrix} = F^{-1}(A)/A \begin{bmatrix} \cos(\phi) & \sin(\phi) \\ -\sin(\phi) & \cos(\phi) \end{bmatrix} \begin{bmatrix} I \\ Q \end{bmatrix}.$$

Therefore, $I'=F^{-1}(A)/A \cos(\phi)I+F^{-1}(A)/A \sin(\phi)Q$ $Q'=F^{-1}(A)/A \cos(\phi)Q-F^{-1}(A)/A \sin(\phi) I$ Since $F^{-1}(A)/A \cos(\phi)$ and $F^{-1}(A)/A \sin(\phi)$ are purely functions of the amplitude A, they can be precomputed and stored in a look-up table as F1(A) and F2(A), and then used as above. Thus, only four multiplications may be used to correct both phase and amplitude distortion.

In the inventive amplifiers described herein, each amplifier amplifies only the I part or the Q part. Therefore it may be expected that amplitude distortion in the I-amplifier would be dominantly dependent on only the I value, while amplitude distortion in the Q-amplifier would be dominantly dependent on the Q value. Likewise, AM-to-PM conversion in the I-amplifier would change the signal phase away from zero (the cosine wave phase) by a phase error amount depending dominantly on the I-value, while AM-to-PM conversion in the Q amplifier would change its signal phase away from 90 degrees (the sine wave phase) by a phase error amount depending dominantly on the Q value. Thus a different precompensation structure may be used to compensate for two different values of AM-to-PM conversion and amplitude distortion, one dependent only on the I-value and the other dependent only on the Q value.

If the AM-to-PM conversion of the I amplifier is described by $\phi(I)$ then the magnitude of the I value will be reduced to $I\cos(\phi(I))$ and an additive error component $I\sin(\phi(I))$ will be added to the Q value. Likewise, describing AM-to-PM conversion of the Q amplifier by $\phi(Q)$, the magnitude of Q will be reduced to $Q\cos(\phi(Q))$, while an additive error $Q\sin(\phi(Q))$ will be subtracted from the I component. If in addition there is an amplitude distortion from I to F(I) and an amplitude distortion from Q to F(Q) that shall be corrected by applying the inverse of the function F, then the total precompensation of the amplitude of I needed is described by the function:

$(F^{-1}(I))/(\cos(\phi(I)))$ and the total precompensation of the amplitude Q needed is described by the function:

$(F^{-1}(Q))/(\cos(\phi(Q)))$.

If the amplifiers are equal, then these functions are the same function with argument I in one case and Q in the other. The entire function may be precomputed and stored. Whether the error component additive to Q produced by the I amplifier is caused by the desired value of I or the precompensated value of I using the above function, it is still dependent only on the value of I and so may also be precomputed and stored in a look-up table for $I\cos(\phi(I))$, and likewise for the error additive to the I value produced in the Q channel.

Figure 6:
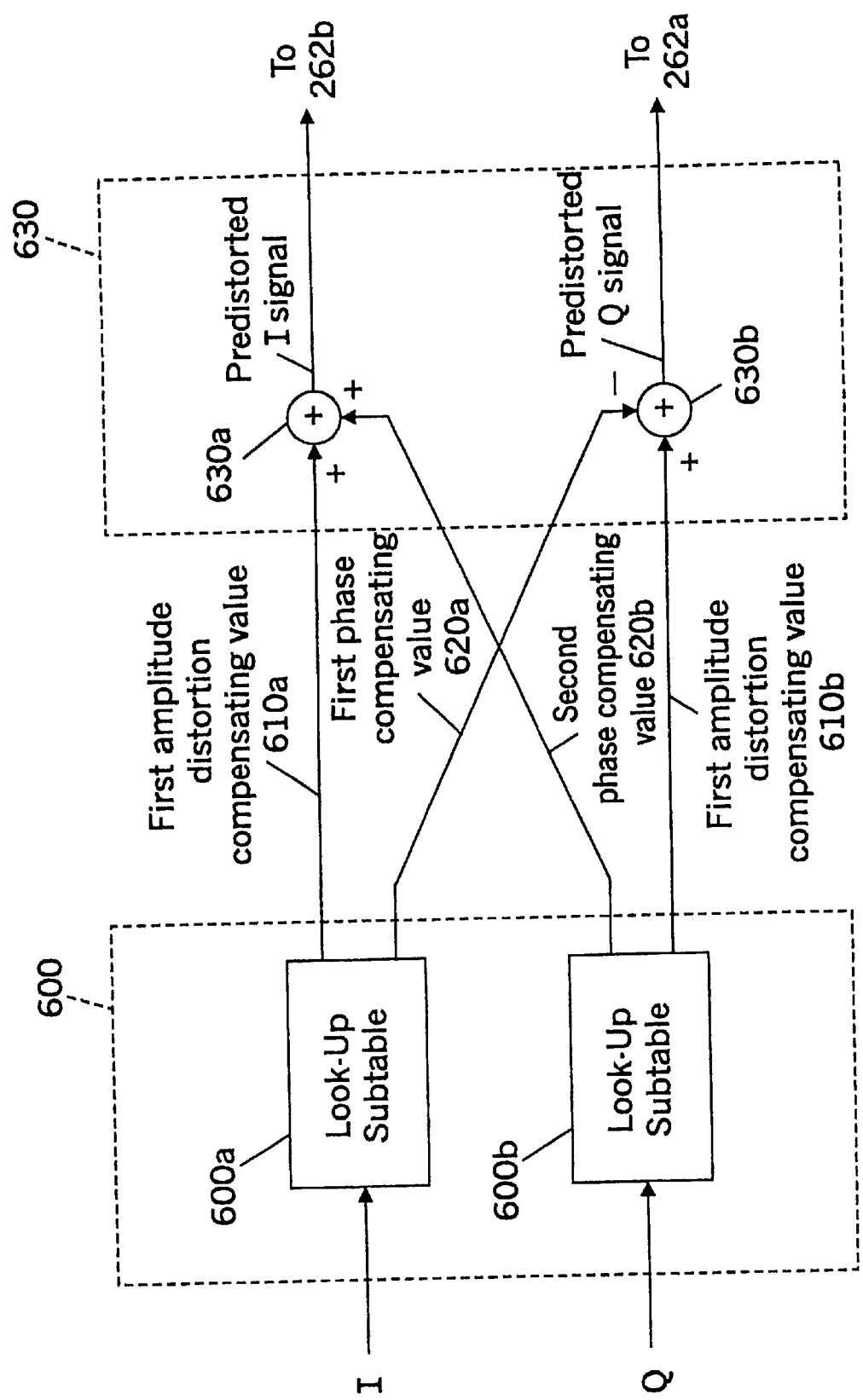
FIG. 6 is a block diagram of compensation systems and methods according to the present invention.

A block diagram of precompensation according to the invention is shown in FIG. 6. The desired I value is applied to a look-up table 600a to obtain a compensated I value F1(I), also referred to as a first amplitude distortion compensating value 610a, and an AM-to-PM compensating value F2(I), also referred to as a first phase compensating value 620a. Likewise the desired Q value is applied to a look-up table 600b, which can be the same look-up table if the amplifiers 210a, 210b and their associated high-level class-D modulators 250a, 250b are identical. If the amplifiers are differently calibrated, then the two look-up tables denoted by 600a, 600b in FIG. 6 can be different subtables of a single lookup table system 600.

The Q value addresses the lookup table 600b, to produce an amplitude-precompensated Q value F1(Q), also referred to as a second amplitude distortion compensating value 610b, and an AM-to-PM compensating value F2(Q), also referred to as a second phase compensating value 620b. The value F2(Q) is added to the value F1(I) in adder 630a while the value F2(I) is subtracted from the value F1(Q) in subtractor 630b of a summer 630. Summer 630 produces precompensated or predistorted I and Q values which, when applied to modulate respective amplifiers, will result in an output after combining the amplifier outputs that more accurately follows the desired I and Q values. The compensated I and Q values may be used to modulate respective amplifiers by applying the modulus (magnitude) of the compensated I value to the high-level, class-D I-modulator 260b, 250b, 264b while applying the sign of the compensated I value to select either inverted or not-inverted phase of cosine wave reference signal from generator 224. Likewise, the modulus (magnitude) of the compensated Q value is applied to the Q-modulator 260a, 250a, 264a while the sign of the compensated Q value selects either inverted or not-inverted sine wave drive from reference 224 shifted in phase by 90 degrees 228.

The above techniques which can compensate either for total-amplitude dependent distortion or distortion dependent on the I and Q components separately may be used together, if distortion of both types exists. The two techniques may be applied in any order, by ensuring that the look-up tables precomputed for the first-applied technique account for distortion already compensated by the second-applied technique.

Other methods of improving linearity include Cartesian Feedback, as for example described in U.S. Pat. No. 5,483,681 to Bergsten et al, which is hereby incorporated by reference herein.

Accordingly, high efficiency power IQ modulation systems and methods may be provided to thereby allow a reduction in the cost, size and/or power consumption of a cellular radiotelephone or other transmitter.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A power modulation system that modulates and amplifies in-phase (I) and quadrature-phase (Q) input signals, the power modulation system comprising:

first and second power amplifiers, each including a signal input, a supply input and a power output;

a source of first, second, third and fourth reference frequency signals, the first and second reference frequency signals being inverted relative to one another and the third and fourth reference frequency signals being inverted relative to one another;

a switching system that selectively applies one of the first and second reference frequency signals to the signal input of the first power amplifier as a function of the polarity of one of the I and Q input signals, and that selectively applies one of the third and fourth reference frequency signals to the signal input of the second power amplifier as a function of the polarity of the other of the I and Q input signals;

a third amplifier that is responsive to the one of the I and Q input signals to supply a first variable supply voltage to the supply input of the first power amplifier;

a fourth amplifier that is responsive to the other of the I and Q input signals to supply a second variable supply voltage to the supply input of the second power amplifier; and a coupler that couples the power outputs of the first and second power amplifiers to a load.

2. A power modulation system according to claim 1 wherein the first and second power amplifiers comprise class-C power amplifiers and wherein the third and fourth amplifiers comprise class-D power amplifiers.

3. A power modulation system according to claim 1 wherein the first, second, third and fourth reference frequency signals are 0°, 180°, 90° and 270° phase shifted reference frequency signals, respectively.

4. A power modulation system according to claim 1 wherein the source of first, second, third and fourth reference frequency signals comprises:
- a controlled oscillator that produces the first reference frequency signal;
- a first inverter that is responsive to the controlled oscillator to produce the second reference frequency signal;
- a phase shifter that is responsive to the controlled oscillator to produce the third reference frequency signal; and
- a second inverter that is responsive to the phase shifter to produce the fourth reference frequency signal.

5. A power modulation system according to claim 1 wherein the switching system comprises:
- a first switch that is responsive to the one of the I and Q input signals being positive to couple the first reference frequency signal to the first power amplifier, and that is responsive to the one of the I and Q input signals being negative to couple the second reference frequency signal to the first power amplifier; and
- a second switch that is responsive to the other of the I and Q input signals being positive to couple the third reference frequency signal to the second power amplifier, and that is responsive to the other of the I and Q input signals being negative to couple the fourth reference frequency signal to the second power amplifier.

6. A power modulation system according to claim 5 wherein the switching system further comprises:
- a first polarity detector that is coupled between the one of the I and Q input signals and the first switch, to detect whether the one of the I and Q input signals is positive or negative; and
- a second polarity detector that is coupled between the other of the I and Q input signals and the second switch, to detect whether the other of the I and Q input signals is positive or negative.

7. A power modulation system according to claim 1 further comprising:
- a first analog-to-digital converter that is coupled between the one of the I and Q input signals and the third amplifier, such that the third amplifier is responsive to a digital representation of the one of the I and Q signals to supply a first variable supply voltage to the supply input of the first amplifier; and
- a second analog-to-digital converter that is coupled between the other of the I and Q input signals and the fourth amplifier, such that the fourth amplifier is responsive to a digital representation of the other of the I and Q signals to supply a second variable supply voltage to the supply input of the second amplifier.

8. A power modulation system according to claim 7 wherein the first analog-to-digital converter comprises a first delta-sigma analog-to-digital converter and wherein the second analog-to-digital converter comprises a second delta-sigma analog-to-digital converter.

9. A power modulation system according to claim 1 wherein the coupler comprises a matching network that couples the first and second power amplifiers to a load.

10. A power modulation system according to claim 9 wherein the coupler further comprises a first quarter wavelength transmission line that couples the first power amplifier to the matching network and a second quarter wavelength transmission line that couples the second power amplifier to the matching network.

11. A power modulation system according to claim 9 wherein the coupler further comprises a first isolator that couples, the first power amplifier to the matching network and a second isolator that couples the second power amplifier to the matching network.

12. A power modulation system according to claim 1 wherein the first and second power amplifiers produce nonlinear distortion, the power modulation system further comprising:
- a compensation system that is responsive to the I and Q input signals, to generate predistorted I and Q signals and to apply the predistorted I and Q signals to at least one of the switching system and to the third and fourth amplifiers, to thereby compensate for the nonlinear distortion.

13. A power modulation system according to claim 12 wherein the compensation system comprises:
- a look-up table that is responsive to the I input signal to produce a first amplitude distortion compensating value and a first phase compensating value, and that is responsive to the Q input signal to produce a second amplitude distortion compensating value and a second phase compensating value; and
- a summer that adds the first amplitude distortion compensating value and the second phase compensating value to produce the predistorted I signal, and that subtracts the first phase compensating value from the second amplitude distortion compensating value to produce the predistorted Q signal.

14. A power modulation system according to claim 13:
- wherein the look-up table is a pair of look-up subtables, a respective one of which is responsive to a respective one of the I input signal and the Q input signal; and
- wherein the summer comprises an adder that adds the first amplitude distortion compensating value and the second phase compensating value to produce the predistorted I signal, and a subtractor that subtracts the first phase compensating value from the second amplitude distortion compensating value to produce the predistorted Q signal.

15. A power modulation system according to claim 1 wherein the I and Q input signals are I and Q radiotelephone communication signals and wherein the load is a radiotelephone antenna.

16. A power modulation system that modulates and amplifies in-phase (I) and quadrature-phase (Q) input signals, the power modulation system comprising:
- first and second means for power amplifying a signal input to produce a power output in response to a supply input;
- means for providing first, second, third and fourth reference frequency signals, the first and second reference frequency signals being inverted relative to one another and the third and fourth reference frequency signals being inverted relative to one another;
- means for selectively applying one of the first and second reference frequency signals to the signal input of the first means for power amplifying as a function of the polarity of one of the I and Q input signals, and for selectively applying one of the third and fourth reference frequency signals to the signal input of the second means for power amplifying as a function of the polarity of the other of the I and Q input signals;
- means for supplying a first variable supply voltage to the supply input of the first means for power amplifying in response to the one of the I and Q input signals;

means for supplying a second variable supply voltage to the supply input of the second means for power amplifying in response to the other of the I and Q input signals; and means for coupling the power outputs of the first and second means for power amplifying to a load.

17. A power modulation system according to claim 16 wherein the first and second means for power amplifying comprise class-C power amplifiers and wherein the means for supplying comprise class-D power amplifiers.

18. A power modulation system according to claim 16 wherein the firsts second, third and fourth reference frequency signals are 0°, 180°, 90° and 270° phase shifted reference frequency signals, respectively.

19. A power modulation system according to claim 16 wherein the means for providing first, second, third and fourth reference frequency signals comprises:

means for producing the first reference frequency signal;

means for inverting the first reference frequency signal to produce the second reference frequency signal;

means for phase shifting the first reference frequency signal to produce the third reference frequency signal; and means for inverting the third reference frequency signal to produce the fourth reference frequency signal.

20. A power modulation system according to claim 16 wherein the means for selectively applying comprises:

first means for coupling the first reference frequency signal to the first power amplifying means in response to the one of the I and Q input signals being positive and for coupling the second reference frequency signal to the first power amplifying means in response to the one of the I and Q input signals being negative; and second means for coupling the third reference frequency signal to the second power amplifying means in response to the other of the I and Q input signals being positive and for coupling the fourth reference frequency signal to the second power amplifying means in response to the other of the I and Q input signals being negative.

21. A power modulation system according to claim 20 wherein the means for selectively applying further comprises:

first means for detecting whether the one of the I and Q input signals is positive or negative, the first means for coupling being responsive to the first means for detecting; and second means for detecting whether the other of the I and Q input signals is positive or negative, the second means for coupling being responsive to the second means for detecting.

22. A power modulation system according to claim 16 further comprising:

first means for converting the one of the I and Q input signals to digital, such that the means for supplying a first variable supply voltage is responsive to a digital representation of the one of the I and Q signals; and second means for converting the other of the I and Q input signals to digital, such that the means for supplying a second variable supply voltage is responsive to a digital representation of the other of the I and Q signals.

23. A power modulation system according to claim 22 wherein the first means for converting comprises a first delta-sigma analog-to-digital converter and wherein the second means for converting comprises a second delta-sigma analog-to-digital converter.

24. A power modulation system according to claim 16 wherein the means for coupling comprises means for matching the first and second means for power amplifying to a load.

25. A power modulation system according to claim 24 wherein the means for coupling further comprises a first quarter wavelength transmission line that couples the first means for power amplifying to the means for matching and a second quarter wavelength transmission line that couples the second means for power amplifying to the means for matching.

26. A power modulation system according to claim 24 wherein the means for coupling further comprises means for isolating the first means for power amplifying and the second means for power amplifying from one another.

27. A power modulation system according to claim 24 wherein the means for matching comprises means for converting voltage to current.

28. A power modulation system according to claim 16 wherein the first and second means for power amplifying produce nonlinear distortion, the power modulation system further comprising:

means for generating predistorted I and Q signals from the I and Q input signals and for applying the predistorted I and Q signals to at least one of the means for selectively applying and the means for supplying, to thereby compensate for the nonlinear distortion.

29. A power modulation system according to claim 28 wherein the means for generating comprises:

means for producing a first amplitude distortion compensating value and a first phase compensating value in response to the I input signal and for producing a second amplitude distortion compensating value and a second phase compensating value in response to the Q input signal; and means for adding the first amplitude distortion compensating value and the second phase compensating value to produce the predistorted I signal, and for subtracting the first phase compensating value from the second amplitude distortion compensating value to produce the predistorted Q signal.

30. A power modulation system according to claim 16 wherein the I and Q input signals are I and Q radiotelephone communication signals and wherein the load is a radiotelephone antenna.

31. A method for modulating and amplifying in-phase (I) and quadrature-phase (Q) input signals, using first and second means for power amplifying a signal input to produce a power output in response to a supply input, the method comprising the steps of:

providing first, second, third and fourth reference frequency signals, the first and second reference frequency signals being inverted relative to one another and the third and fourth reference frequency signals being inverted relative to one another;

selectively applying one of the first and second reference frequency signals to the signal input of the first means for power amplifying, as a function of the polarity of one of the I and Q input signals;

selectively applying one of the third and fourth reference frequency signals to the signal input of the second means for power amplifying as a function of the polarity of the other of the I and Q input signals;

supplying a first variable supply voltage to the supply input of the first means for power amplifying in response to the one of the I and Q input signals;

supplying a second variable supply voltage to the supply input of the second means for power amplifying in response to the other of the I and Q input signals; and coupling the power outputs of the first and second means for power amplifying to a load.

32. A method according to claim 31 wherein the first and second means for power amplifying comprise class-C power amplifiers and wherein the supplying steps use class-D power amplifiers.

33. A method according to claim 31 wherein the first, second, third and fourth reference frequency signals are 0°, 180°, 90° and 270° phase shifted reference frequency signals, respectively.

34. A method according to claim 31 wherein the step of providing first, second, third and fourth reference frequency signals comprises the steps of:

producing the first reference frequency signal;

inverting the first reference frequency signal to produce the second reference frequency signal;

phase shifting the first reference frequency signal to produce the third reference frequency signal; and inverting the third reference frequency signal to produce the fourth reference frequency signal.

35. A method according to claim 31 wherein the steps of selectively applying comprise the steps of:

coupling the first reference frequency signal to the first power amplifying means in response to the one of the I and Q input signals being positive;

coupling the second reference frequency signal to the first power amplifying means in response to the one of the I and Q input signals being negative;

coupling the third reference frequency signal to the second power amplifying means in response to the other of the I and Q input signals being positive; and coupling the fourth reference frequency signal to the second power amplifying means in response to the other of the I and Q input signals being negative.

36. A method according to claim 35 wherein the steps of selectively applying further comprise the steps of:

detecting whether the one of the I and Q input signals is positive or negative; and detecting whether the other of the I and Q input signals is positive or negative.

37. A method according to claim 31 further comprising the steps of:

converting the one of the I and Q input signals to digital, such that the step of supplying a first variable supply voltage is responsive to a digital representation of the one of the I and Q signals; and converting the other of the I and Q input signals to digital, such that the step of supplying a second variable supply voltage is responsive to a digital representation of the other of the I and Q signals.

38. A method according to claim 37 wherein the steps of converting comprise the steps of delta-sigma converting.

39. A method according to claim 31 wherein the step of coupling comprises the step of matching the first and second means for power amplifying to a load.

40. A method according to claim 39 wherein the step of coupling comprises the step of quarter wavelength transmission line matching the first means for power amplifying and the second means for power amplifying.

41. A method according to claim 39 wherein the step of coupling comprises the step of isolating the first means for power amplifying and the second means for power amplifying from one another.

42. A method according to claim 39 wherein the step of matching further comprises the step of converting voltage to current.

43. A method according to claim 31 wherein the first and second means for power amplifying produce nonlinear distortion, the power modulation method further comprising the step of:

generating predistorted I and Q signals from the I and Q input signals, at least one of the selectively applying steps and the supplying steps being responsive to the predistorted I and Q signals, to thereby compensate for the nonlinear distortion.

44. A method according to claim 43 wherein the generating step comprises the steps of:

producing a first amplitude distortion compensating value and a first phase compensating value in response to the I input signal;

producing a second amplitude distortion compensating value and a second phase compensating value in response to the Q input signal;

adding the first amplitude distortion compensating value and the second phase compensating value to produce the predistorted I signal; and subtracting the first phase compensating value from the second amplitude distortion compensating value to produce the predistorted Q signal.

45. A power modulation method according to claim 31 wherein the I and Q input signals are I and Q radiotelephone communication signals and wherein the load is a radiotelephone antenna.

46. A system that amplifies in-phase (I) and quadrature-phase (Q) input signals, the system comprising:

first and second linear power amplifiers that also produce nonlinear distortion; and a compensation system that is responsive to the I and Q input signals, to generate predistorted I and Q signals, to apply the predistorted I signal to the first linear power amplifier and to apply the predistorted Q signal to the second linear power amplifier, to thereby compensate for the nonlinear distortion that also is produced by the first and second linear power amplifiers.

47. A system according to claim 46 wherein the compensation system comprises:

a look-up table that is responsive to the I input signal to produce a first amplitude distortion compensating value and a first phase compensating value, and that is responsive to the Q input signal to produce a second amplitude distortion compensating value and a second phase compensating value; and a summer that adds the first amplitude distortion compensating value and the second phase compensating value to produce the predistorted I signal, and that subtracts the first phase compensating value from the second amplitude distortion compensating value to produce the predistorted Q signal.

48. A system according to claim 47:

wherein the look-up table is a pair of look-up subtables, a respective one of which is responsive to a respective one of the I input signal and the Q input signal; and wherein the summer comprises an adder that adds the first amplitude distortion compensating value and the second phase compensating value to produce the predistorted I signal, and a subtractor that subtracts the first phase compensating value from the second amplitude distortion compensating value to produce the predistorted Q signal.

49. A system that amplifies in-phase (I) and quadrature-phase (Q) input signals, the system comprising:
first and second means for linearly power amplifying that also produce nonlinear distortion; and
means for generating predistorted I and Q signals from the I and Q input signals, for applying the predistorted I signal to the first means for linearly power amplifying and for applying the predistorted Q signal to the second means for linearly power amplifying, to thereby compensate for the nonlinear distortion that also is produced by the first and second means for linearly power amplifying.

50. A power modulation system according to claim 49 wherein the means for generating comprises:
means for producing a first amplitude distortion compensating value and a first phase compensating value in response to the I input signal and for producing a second amplitude distortion compensating value and a second phase compensating value in response to the Q input signal; and
means for adding the first amplitude distortion compensating value and the second phase compensating value to produce the predistorted I signal, and for subtracting the first phase compensating value from the second amplitude distortion compensating value to produce the predistorted Q signal.

51. A method for amplifying in-phase (I) and quadrature-phase (Q) input signals, the method comprising the steps of:
generating predistorted I and Q signals from the I and Q input signals;
applying the predistorted I signal to a first linear power amplifier; and
applying the predistorted Q signal to a second linear power amplifier, to thereby compensate for nonlinear distortion that also is produced in the first and second linear power amplifier.

52. A method according to claim 51 wherein the generating step comprises the steps of:
producing a first amplitude distortion compensating value and a first phase compensating value in response to the I input signal;
producing a second amplitude distortion compensating value and a second phase compensating value in response to the Q input signal;
adding the first amplitude distortion compensating value and the second phase compensating value to produce the predistorted I signal; and
subtracting the first phase compensating value from the second amplitude distortion compensating value to produce the predistorted Q signal.

* * * * *

UNITED STATES PATENT AND TRADEMARK OFFICE
CERTIFICATE OF CORRECTION

PATENT NO. : 6,181,199 B1
DATED : January 30, 2001
INVENTOR(S) : William O. Camp, Jr. et al.

It is certified that error appears in the above-identified patent and that said Letters Patent is hereby corrected as shown below:

Column 13,
Line 12, please delete "firsts" and substitute -- first, --.

Signed and Sealed this

Twenty-fifth Day of September, 2001

*Attest:*

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO. : 6,181,199 B1
DATED : January 30, 2001
INVENTOR(S) : William O. Camp, Jr. et al.

It is certified that error appears in the above-identified patent and that said Letters Patent is hereby corrected as shown below:

Column 13,
Line 12, please delete "firsts" and substitute -- first, --.

Signed and Sealed this

Twenty-fourth Day of May, 2005

JON W. DUDAS
*Director of the United States Patent and Trademark Office*